US009706678B1

(12) United States Patent
Chen et al.

(10) Patent No.: US 9,706,678 B1
(45) Date of Patent: Jul. 11, 2017

(54) CONFIGURABLE SERVER CHASSIS (71) Applicant: Quanta Computer Inc., Taoyuan (TW)

(72) Inventors: Chao-Jung Chen, Taoyuan (TW);
Yaw-Tzorng Tsorng, Taoyuan (TW);
Chun Chang, Taoyuan (TW); Chen Tseng, Taoyuan (TW)

(73) Assignee: QUANTA COMPUTER, INC., Taoyuan (TW)

( * ) Notice: Subject to any disclaimer, the term of this patent is extended or adjusted under 35 U.S.C. 154(b) by 0 days.

(21) Appl. No.: 15/096,073

(22) Filed: Apr. 11, 2016

(51) Int. Cl.
*H05K 7/00* (2006.01)
*H05K 7/14* (2006.01)

(52) U.S. Cl.
CPC ......... *H05K 7/1489* (2013.01); *H05K 7/1491* (2013.01)

(58) Field of Classification Search
CPC ...... H05K 7/1489; H05K 7/14; H05K 7/1488; H05K 5/02; H05K 5/0217
See application file for complete search history.

(56) References Cited

U.S. PATENT DOCUMENTS

| 8,132,869 B2 | 3/2012 | Wang et al. | |
| 2013/0278124 A1* | 10/2013 | Hu | A47B 96/025 312/333 |
| 2014/0340837 A1* | 11/2014 | Jau | G06F 1/16 361/679.33 |
| 2015/0208543 A1* | 7/2015 | Chen | H05K 7/1489 361/679.39 |
| 2016/0150668 A1* | 5/2016 | Cheng | H05K 7/1489 361/679.02 |

FOREIGN PATENT DOCUMENTS

| CN | 104793709 A | 7/2015 |
| TW | 354777 M | 4/2009 |

OTHER PUBLICATIONS

Taiwanese Application No. TW105117544 Office Action and Search Report mailed Feb. 23, 2017.

* cited by examiner

*Primary Examiner* — Daniel Rohrhoff
(74) *Attorney, Agent, or Firm* — Nixon Peabody LLP; Eduardo J. Quinones (57) ABSTRACT

Server chassis having a main chassis with a bottom surface and first and second lower sidewalls that extend vertically from opposing sides of the bottom surface. First and second flanges extend horizontally outward from the first and second lower sidewalls, respectively. First and second upper sidewalls vertically extend from the first and second flanges. The distance between the first and second upper sidewalls is greater than the distance between first and second lower sidewalls. A tray resting on each of the flanges divides a portion of the main chassis into an upper and a lower portion. A first lateral recess is defined by the first lower sidewall and the first flange, and a second lateral recess is defined by the second lower sidewall and the second flange. The first and second recesses are configured to receive a rail defining an outer boundary substantially flush with the first and second sidewalls.

12 Claims, 14 Drawing Sheets

CONFIGURABLE SERVER CHASSIS

FIELD

The subject matter herein a server chassis, more specifically to a configurable server chassis.

BACKGROUND

Server racks are configured to receive one or more server chassis therein. Server racks have standardized sizing for receiving a server chassis. A rack height unit of height (1U) is a commonly defined set of dimensions for a server chassis and server rack. Server chassis and server racks come in a large variety of sizes based around the 1U concept. A 1U rack height is approximately 44.45 millimeters and a 2U rack height is approximately 88.9 millimeters. For example, server racks can be configured to receive a 1U server chassis, a 2U server chassis, a 4U server chassis, or a combination thereof. Multiple rack unit height server chassis configured to be received in a server rack, such as 2U or 4U, generally have a uniform width across the multiple rack units and can be viewed as ordinary server chassis and use common rail kit for rack mounting.

BRIEF DESCRIPTION OF THE DRAWINGS

Implementations of the present technology will now be described, by way of example only, with reference to the attached figures, wherein.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like. The term "about" or "approximately" in connection with a numerical characteristic is within a range of error of a measuring tool for the characteristic.

Embodiments of the present disclosure relates to a server chassis having a main chassis with a bottom surface and first and second lower sidewalls vertically extending from opposing sides of the bottom surface. A first flange and a second flange extend horizontally outward from the first and second lower sidewalls, respectively. First and second upper sidewalls vertically extending from the first and second flanges, respectively. The distance between the first and second upper sidewalls is greater than the distance between first and second lower sidewalls. A first lateral recess is defined by the first lower sidewall and the first flange, and a second lateral recess is defined by the second lower sidewall and the second flange. The first and second recesses being configured to receive a rail defining an outer boundary substantially flush with the first and second sidewalls, respectively.

The server chassis can have a tray receivable in the main chassis and configured to rest on each of the flanges, thereby dividing the main chassis into an upper portion and lower portion having different widths. The tray can span the entire length of the flanges, or only a portion of the length of each flange.

The tray can have vertically extending tray sidewalls substantially parallel to the upper sidewalls. Each of the tray sidewalls can have one or more protrusions outwardly extending therefrom and receivable into a corresponding groove formed on the upper sidewalls, thereby securing the tray with the main chassis.

The tray can be slidably coupled to the main chassis between an extended position and a withdrawn position. The slidable coupling can include inner rails and outer rails configured to engage allowing the tray to slide between the extended position and the withdrawn position. The inner rail disposed on the outwardly facing surface of the tray sidewall and the outer rail disposed on the inwardly facing surface of the upper sidewall.

The tray can be pivotally attached to the main chassis at a front edge and configured to be pivoted between an extended position and a withdrawn position. The extended position having the tray pivoted away from the main chassis and the withdrawn position having the tray pivoted to be received within the main chassis.

The tray can also include a cable management arrangement to direct cabling between the upper portion and the lower portion. The cable management arrangement can assist in cabling for a slidable tray or a pivoting tray and allow the components in the upper or lower portion to remain coupled with components in the other of the upper or lower portion while the tray is in either an extended or withdrawn position.

While the illustrated embodiments are drawn to a 2U configurable server chassis, the present disclosure can be implemented in a 4U, 6U, or any multiple rack height arrangement. Further, while the illustrated embodiments are drawn to a configurable server chassis having a wider upper portion, the present disclosure can be implemented with a lower portion being wider than the upper portion.

Figure 1:
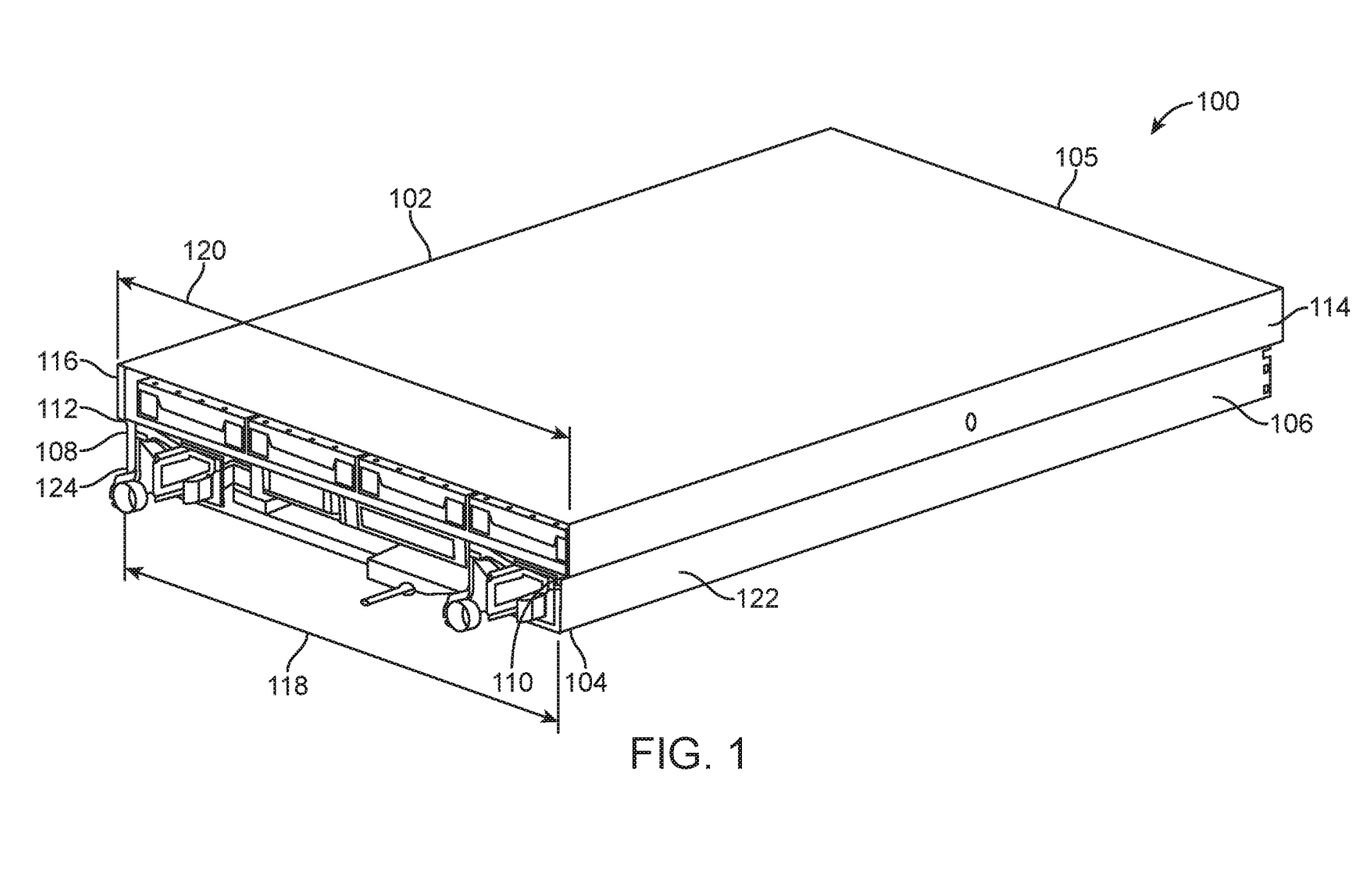
FIG. 1 is an isometric view of an example embodiment of a configurable server chassis.

FIG. 1 illustrates an example embodiment of a configurable server chassis 100. The configurable server chassis 100 can have a main chassis 102 with a bottom surface 104. The configurable server chassis 100 can have a top surface 105 to enclose the main chassis 102. A first lower sidewall 106 and second lower sidewalls 108 extend vertically from opposing sides of the bottom surface 104. A first flange 110 and a second flange 112 extend horizontally outward, and substantially parallel to the bottom surface 104, from the first and second lower sidewalls 106, 108, respectively. A first upper sidewall 114 and second upper sidewall 116 extend vertically from the first and second flanges 110, 112, respectively. The first and second lower sidewalls 106, 108 are separated by a first distance 118 and the first and second upper sidewalls 114, 116 are separated by a second distance 120. The first distance 118 is less than the second distance 120 by approximately the width of the first and second flanges 110,112. In at least one embodiment, the first distance is approximately 430 millimeters and the second distance is approximately 447 millimeters.

Figure 2:
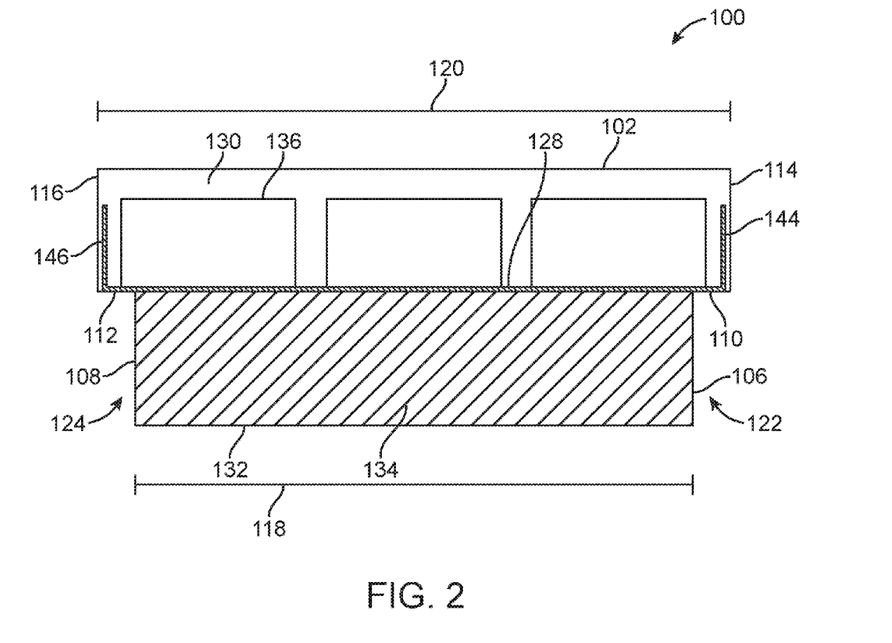
FIG. 2 is a front view of an example embodiment of a configurable server chassis.

As can be appreciated in FIG. 2, the main chassis 102 can receive a tray 128 configured to rest on each of the first and second flanges 110, 112. The tray 128 divides the main chassis 102 into an upper portion 130 and a lower portion 132, each of different widths as discussed above.

Figure 3:
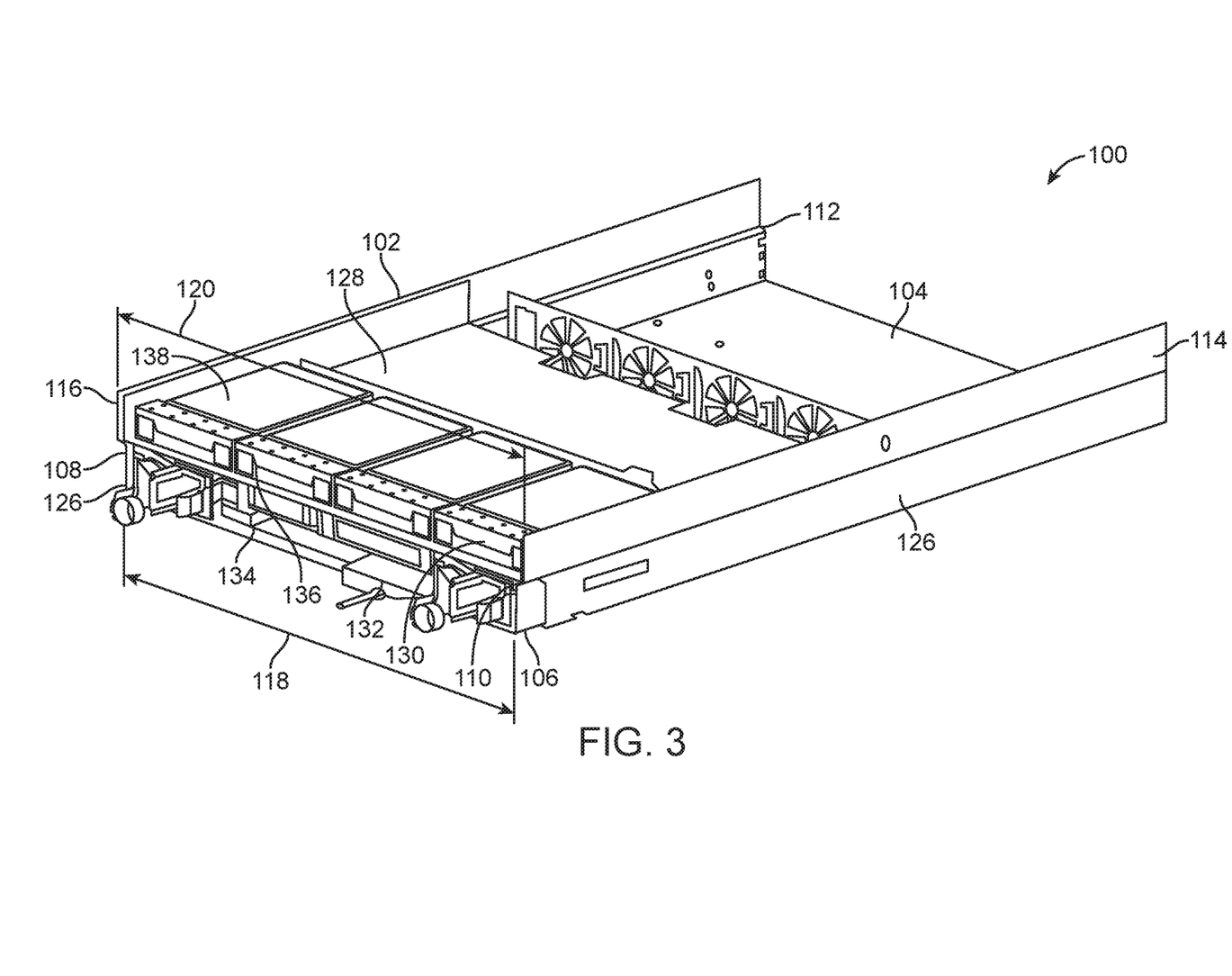
FIG. 3 is an isometric view of an example embodiment of the configurable server chassis having an inner rail.

FIG. 3 illustrates an example embodiment of a configurable server chassis 100 having an inner rail 126. A first lateral recess 122 is defined by the first lower sidewall 106 and the first flange 110 and a second lateral recess 124 is defined by the second lower sidewall 108 and second flange 112. The first and second lateral recesses 122, 124 are each configured to receive a rail 126 defining an outer boundary substantially flush with the first and second upper sidewalls 114, 116. The inner rail 126 is configured to engage with an outer rail (not shown) disposed on a server rack assembly. The engagement between the inner rail 126 and the outer rail allows the main chassis 102 to transition between an open position and a closed position. As is known in the art, in the open position the configurable server chassis 100 is at least partially removed from the server rack assembly. In the closed position, the configurable server chassis 102 is substantially received within the server rack assembly.

The tray 128 can span the entire length of each flange 110, 112 or only a portion of the length of each flange 110, 112. In the illustrated embodiment, the tray 128 extends approximately half the length of each flange 110, 112. Similarly, the upper portion 130 and lower portion 132 extend approximately half the length of each flange 110, 112 and the remaining portion of the main chassis 102 is undivided.

The upper portion 130 and lower portion 132 can each be individually configured to receive a variety of components 136 depending on the requirements of a user. The tray 128 can be modularly removable and replaceable to offer various components 136 within a particular main chassis 102. In the illustrated embodiment, the lower portion 132 has a standard 1U electronic device 134, such as a server, received therein. The electronic device 134 can include, but is not limited to, a circuit board, a processor, memory, fans, or any combination thereof. The present disclosure is not limited to the type or number of devices placed in the lower portion 132.

The upper portion 130 has a plurality of components 136 received therein. As can be appreciated in FIGS. 2-4, the plurality of components 136 can be storage devices, PCIe devices, graphics processing units (GPU), or any other component configured to be coupled with an electronic device 134. Referring to FIG. 3, the tray 128 has four storage devices 138 disposed therein. The storage devices 138 are coupled with the electronic device 134 disposed in the lower portion 132. The four storage devices 138 are shown in a single row configuration; however, the tray 128 can be sized to accommodate one or more rows and one ore more storage devices 138 depending on the specific requirements of the user. In other embodiments, the components 136 can be disposed in the lower portion 132 and the electronic device 134 can be disposed in the upper portion 130. The present disclosure is not limited to the type or number of devices placed in the upper portion 130.

Figure 4:
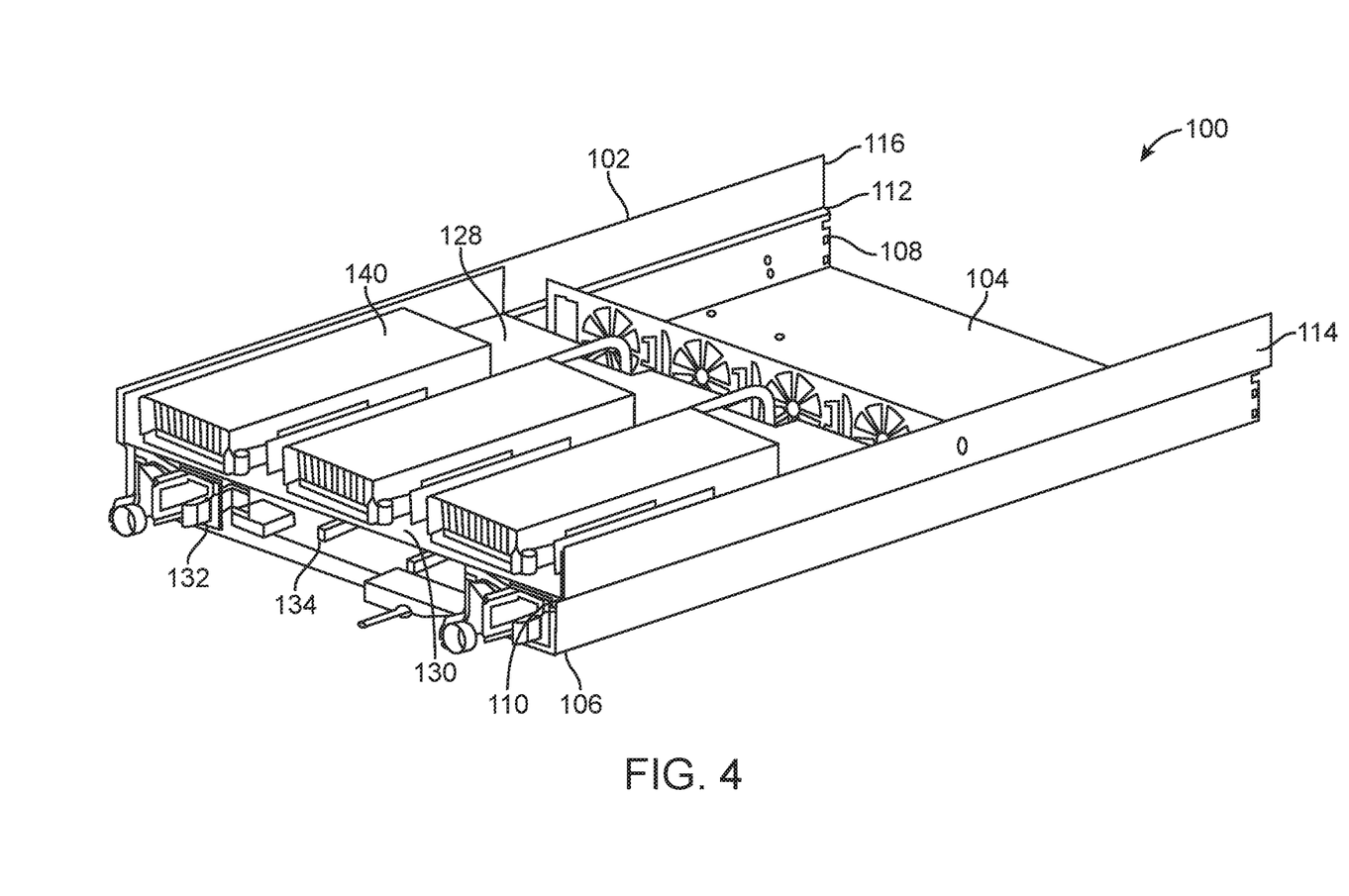
FIG. 4 is an isometric view of an example embodiment of a configurable server chassis having a tray configured to receive a plurality of general purpose graphics processing units (GPGPU)

FIG. 4 illustrates an example embodiment of a tray receiving a plurality of general purpose graphic processing units (GPGPU). The tray 128 has three GPGPU components 140 received therein and coupled with the electronic device 134 disposed in the lower portion 132. While the illustrated embodiment is drawn to three GPGPU components 140, more or less GPGPU components 140 can be implemented within the configurable server chassis 100. In other embodiments, one, two, six, or any number of GPGPU components 140 can be received in tray 128 and coupled with the electronic device 134 disposed in the lower portion 132.

Figure 5:
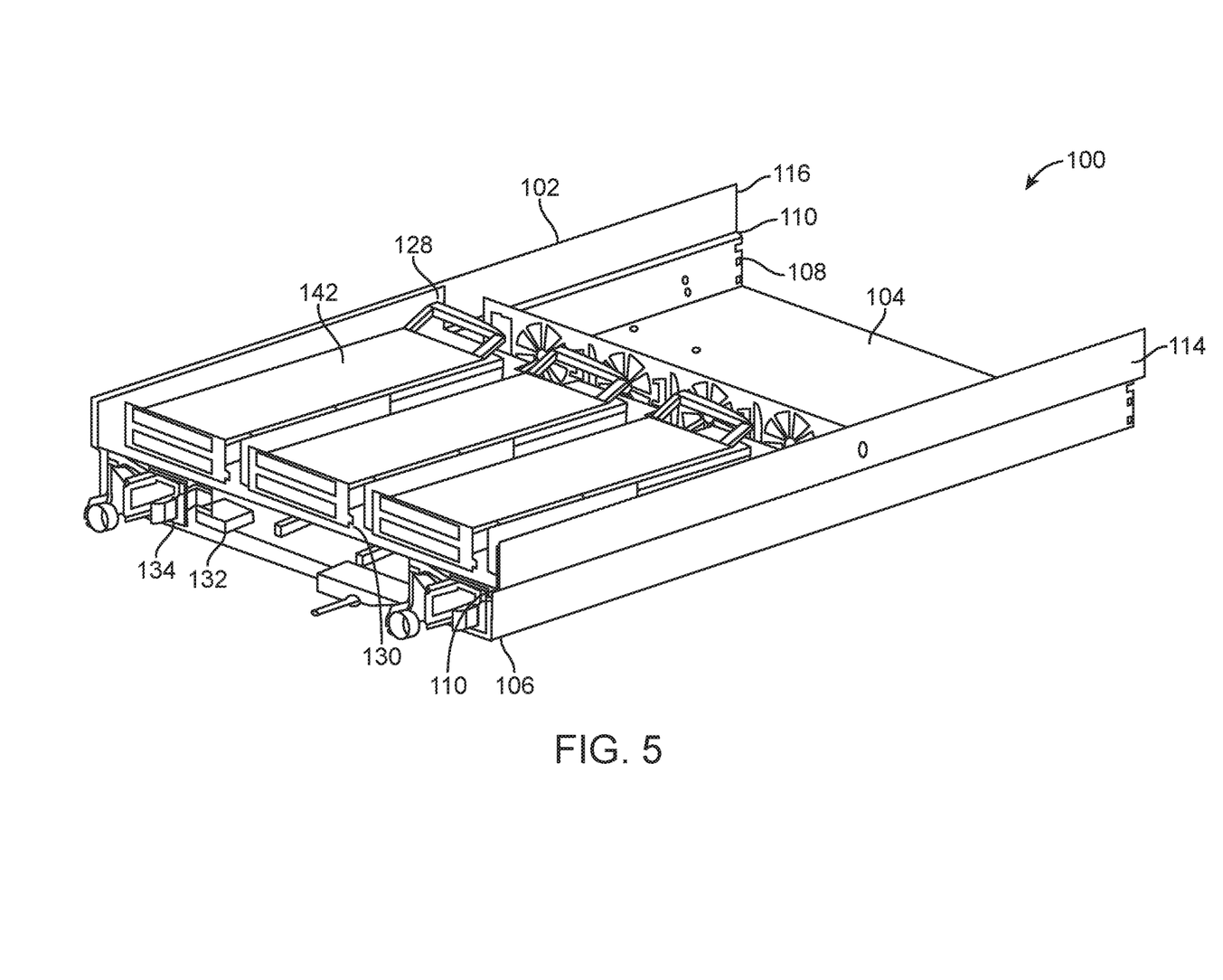
FIG. 5 is an isometric view of an example embodiment of a configurable server chassis having a tray configured to receive a plurality of peripheral component interconnect express (PCIe) components.

FIG. 5 illustrates an example embodiment of a tray receiving a plurality of PCIe components. The tray 128 has six PCIe components 142 received therein and coupled with the electronic device 134 disposed in the lower portion 132. While the illustrated embodiment is drawn to six PCIe components 142, more or less PCIe components 142 can be implemented within the configurable server chassis 100. In other embodiments, one, two, three, or any number of PCIe components 142 can be received in tray 128 and coupled with the electronic device 134 disposed in the lower portion 132.

Figure 6:
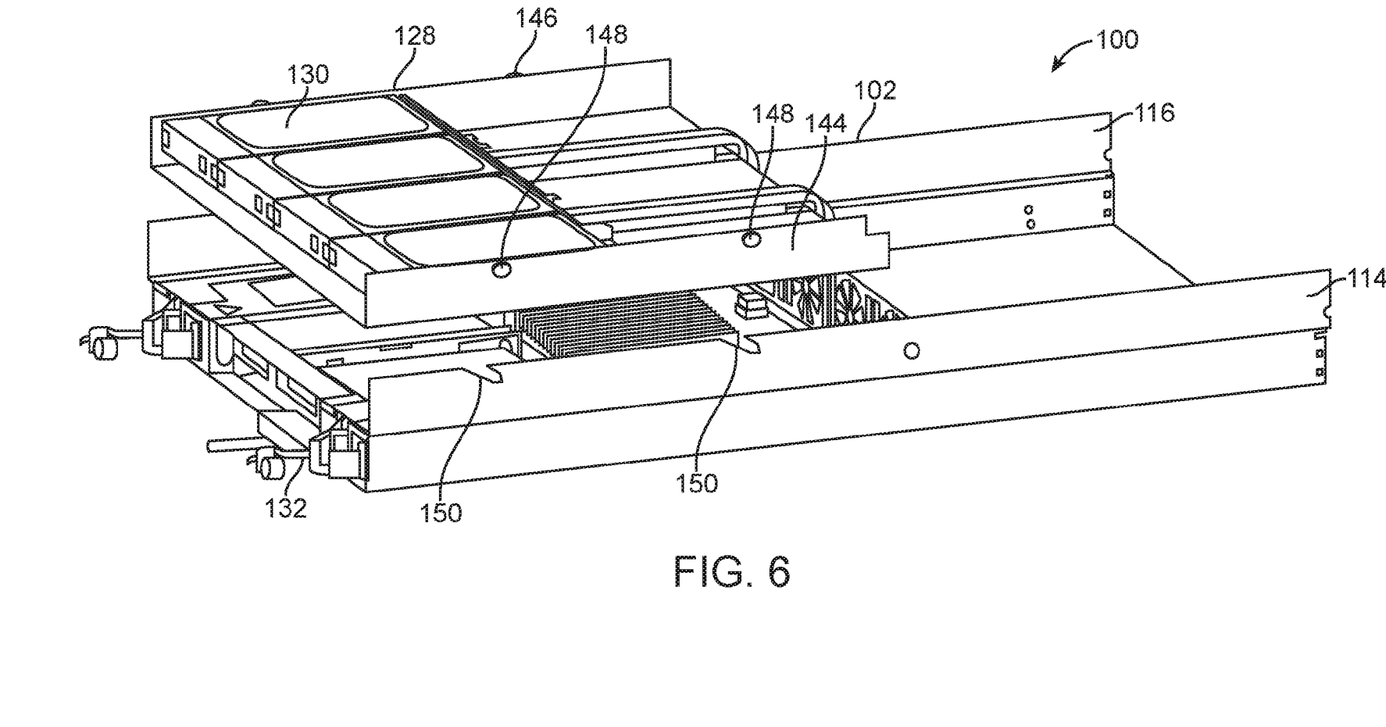
FIG. 6 is an partially exploded view of an example embodiment removable tray of a configurable server chassis.
Figure 7:
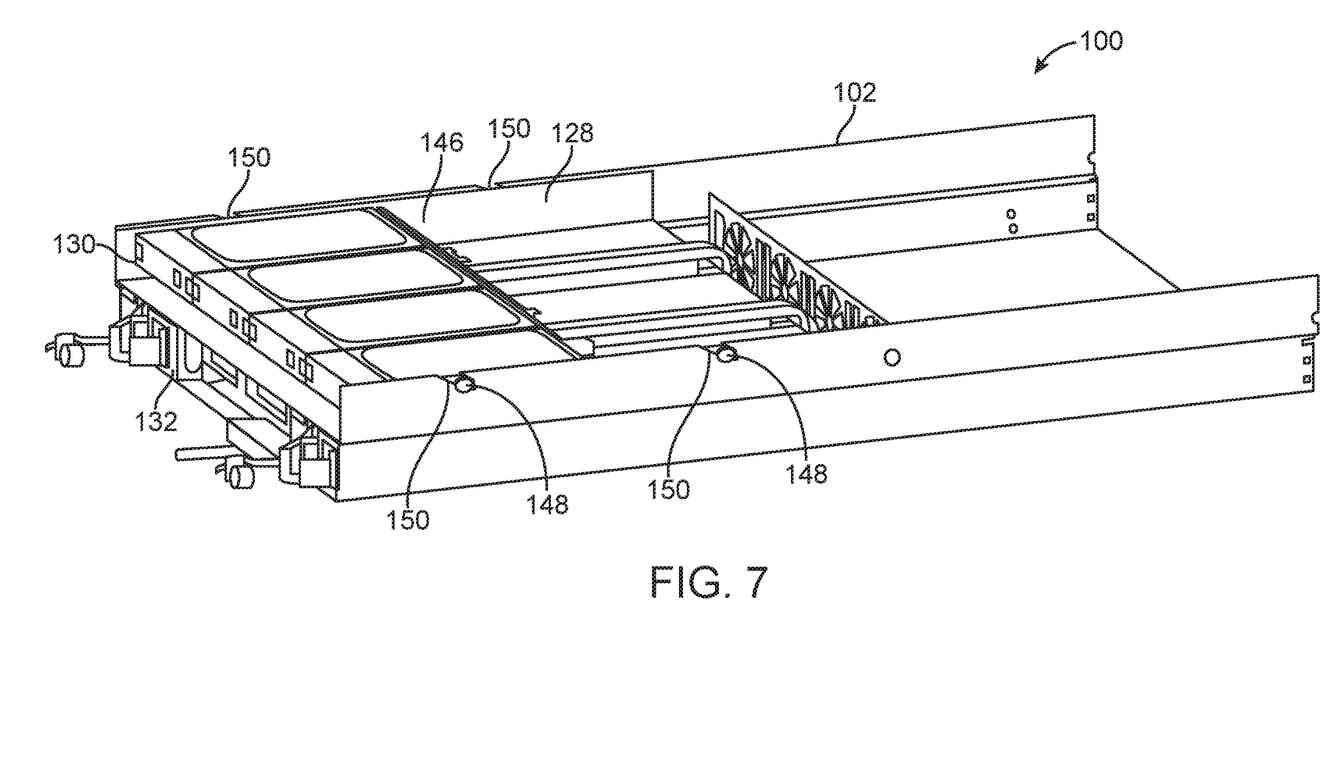
FIG. 7 is an assembled isometric view of an example embodiment removable tray of a configurable server chassis.

FIGS. 6 and 7 illustrate an example embodiment of a configurable server chassis 100 having a removable tray 128. The tray 128 can be removable from the main chassis 102 allowing the configuration of the tray 128 to be adjusted, such as to receive different components 136. In at least one embodiment, the tray 128 is configured to be modular such that a user can switch between various tray 128 configurations (shown in FIGS. 2-4) depending on the desired use of the configurable server chassis 100. In other embodiments, a specific tray 128 can be transitionable between various configurations and capable of receiving a plurality of components 136 in different configurations.

The tray can have two vertically extending tray sidewalls 144, 146 adjacent to and substantially parallel to the upper sidewalls 114, 116. The height of the tray sidewalls 144, 146 can be equal to or less than the height of the upper sidewalls 114, 116. Each tray sidewall 144, 146 can have one or more outwardly protrusions 148 configured to be received in a corresponding groove 150 formed in the upper sidewalls 114, 116. The protrusions 148 secure the tray 128 to the main chassis 102 and prevent movement of the tray 128 during transitioning of the main chassis 102 between the open and closed positions. In at least one embodiment, the protrusions 148 are rivets having larger diameter at the end disposed away from the tray sidewalls 144, 146. The increased diameter prevents lateral movement of the tray during transitioning and ensures proper coupling of the tray 128 with the main chassis 102.

Figure 8:
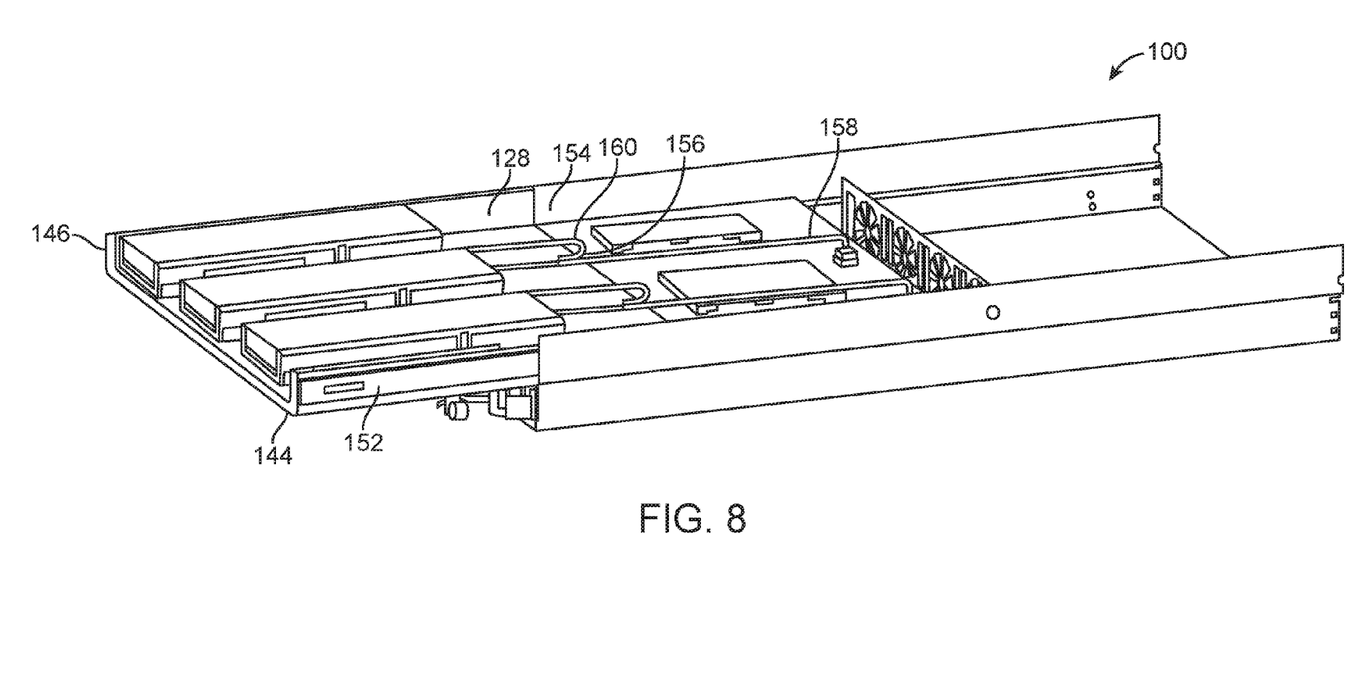
FIG. 8 is an isometric view of a second embodiment removable tray of a configurable server chassis in an extended position.
Figure 9:
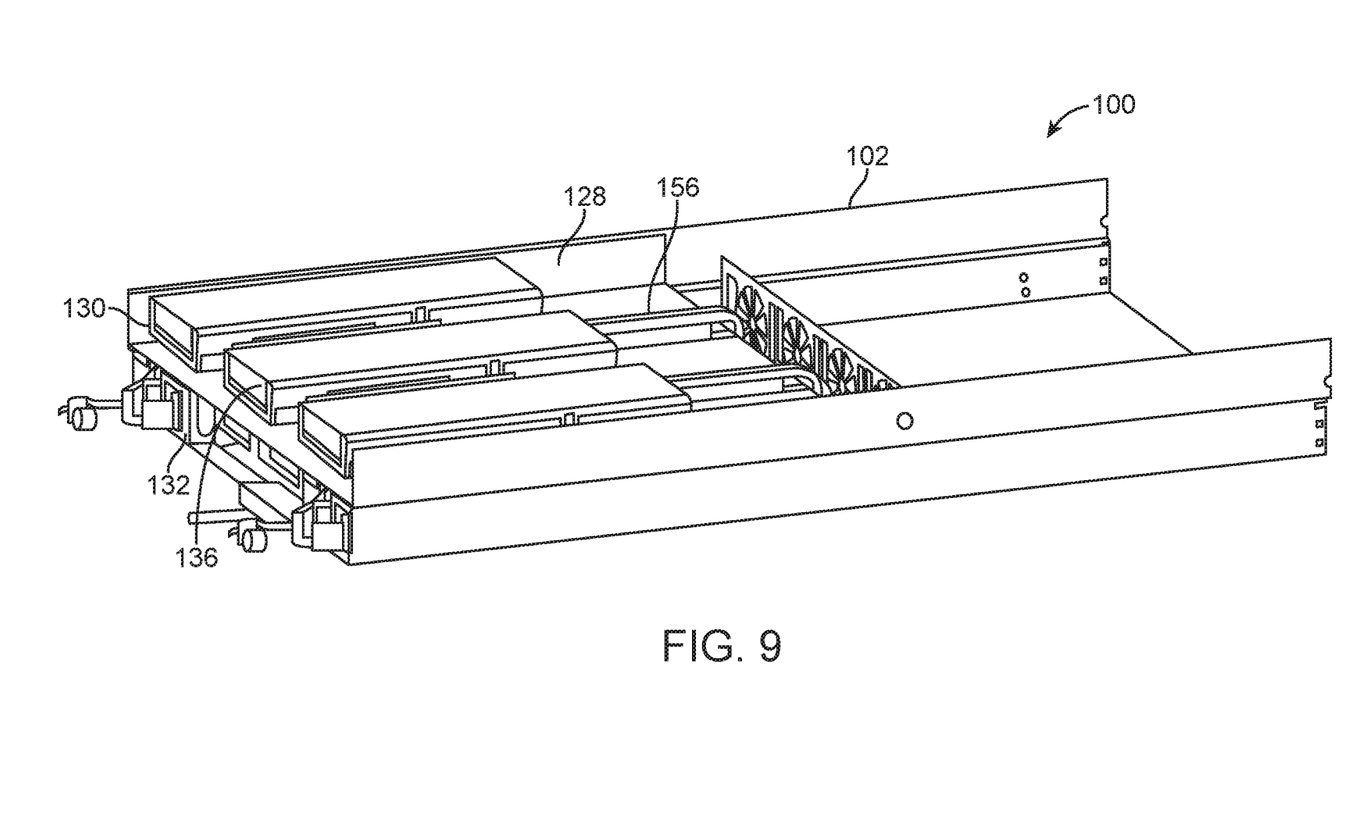
FIG. 9 is an isometric view of a second embodiment removable tray of a configurable server chassis in a withdrawn position.

FIGS. 8 and 9 illustrate a second embodiment of a tray 128 within a configurable server chassis 100. The tray 128 can be slidably coupled with the main chassis 102 and transitionable between an extended position and a withdrawn position. In the extended position, the tray 128 is at least partially removed outside of the main chassis 102. In the withdrawn position, the tray 128 is substantially received within the main chassis 102.

In the illustrated embodiment, a tray rail 152 can be disposed on the bottom surface of the tray 128 and configured to engage with the corresponding rail 154 disposed on the main chassis 102. In other embodiments, the tray rail 152 is disposed on the outer surface of each tray sidewall 144, 146 and configured to engage in a corresponding tray rail 154 disposed on the inner surface of the upper sidewalls 114, 116.

The tray 128 can also include a cable management arrangement 156 configured to route cables within the tray 128 so as to not interfere with the tray rail 152 and corresponding rail 154 as the tray 128 transitions between the extended position and the withdrawn position. The cables 158 can couple the components 136 in the upper portion 130 with the electronic device 134 in the lower portion 132.

The cable management arrangement 156 can have a rail structure 158 for each component 136 with a rail engagement member 160. The rail engagement member slides along the rail structure 158 as the tray 128 transitions from transitions between the extended position and the withdrawn position.

Figure 10:
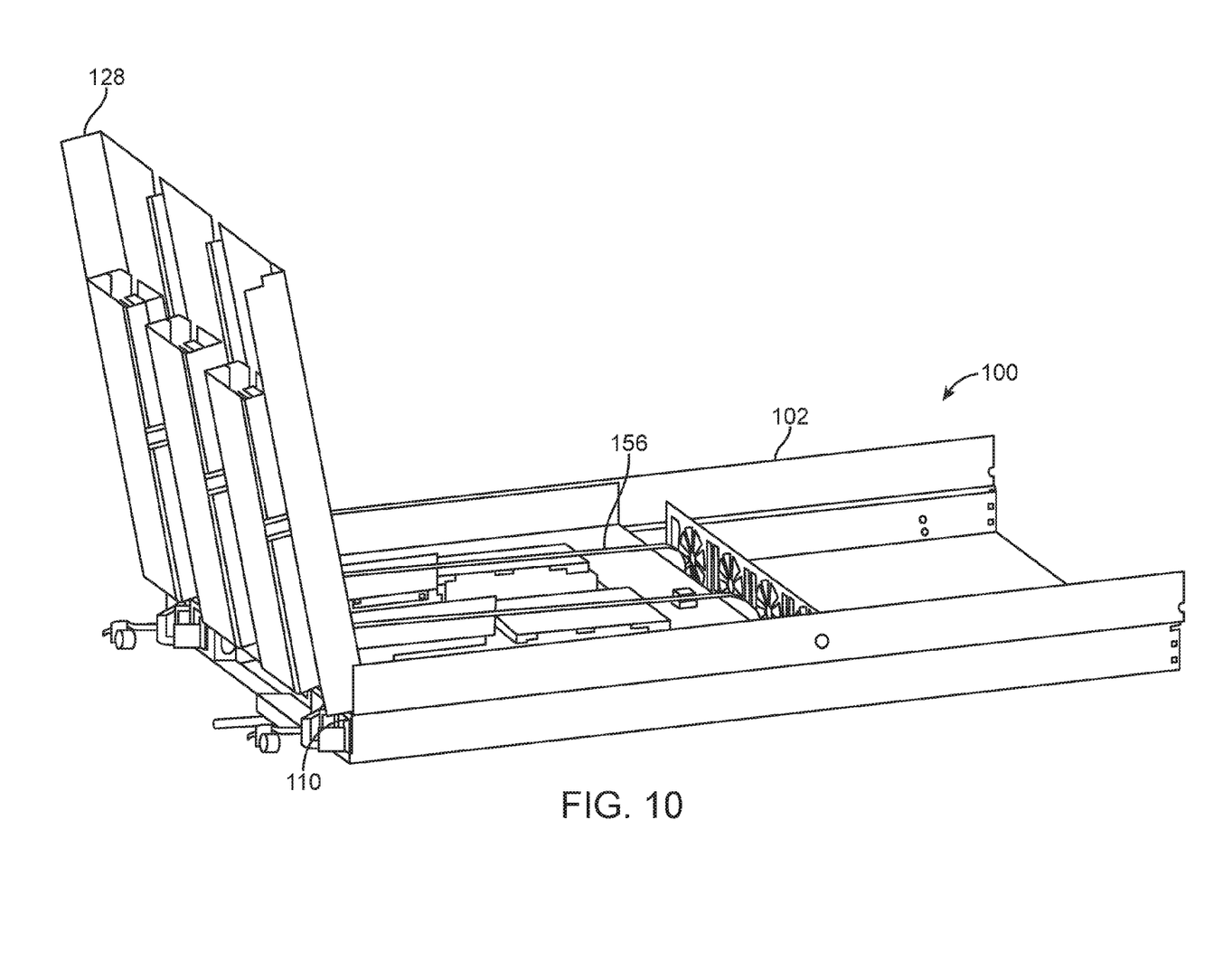
FIG. 10 is an isometric view of a third embodiment removable tray of a configurable server chassis in an extended position.
Figure 11:
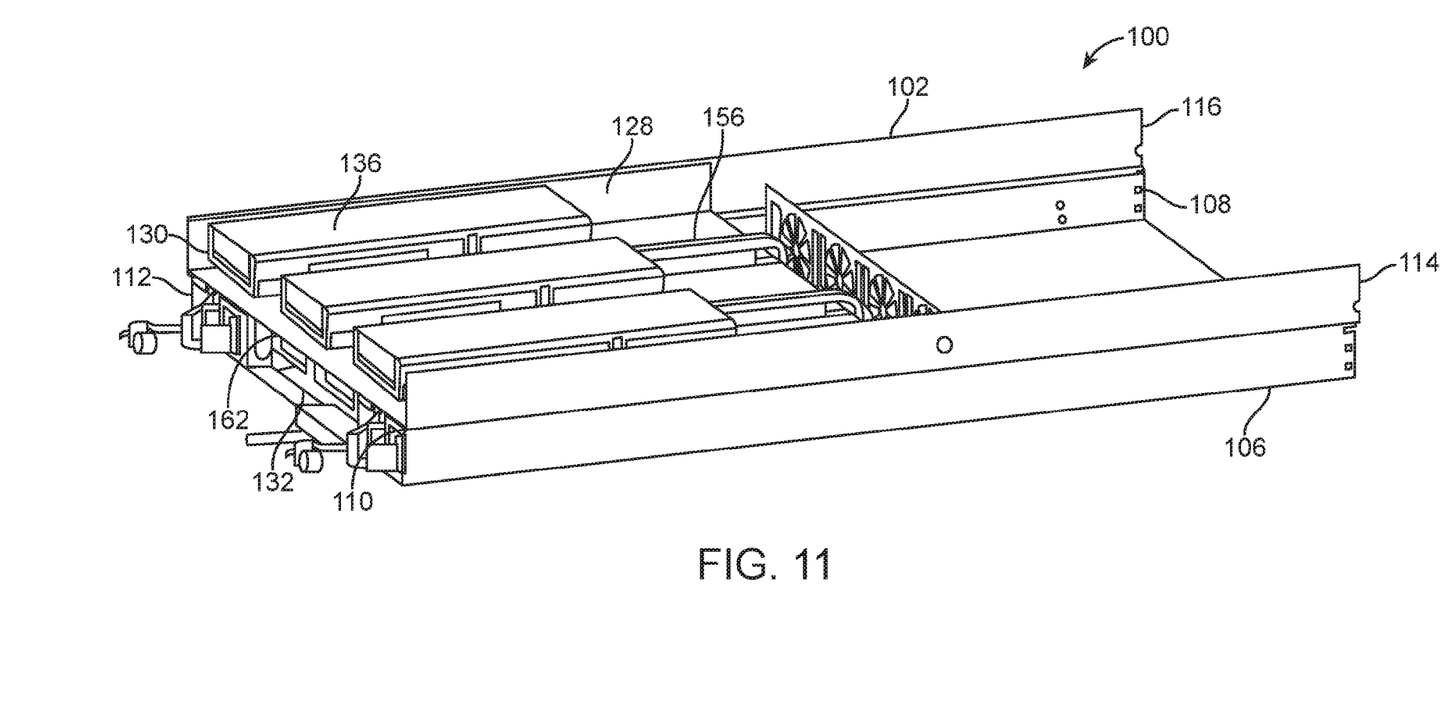
FIG. 11 is an isometric view of a third embodiment removable tray of a configurable server chassis in a withdrawn position.

FIGS. 10 and 11 illustrate a third embodiment of a removable tray within a configurable server chassis 100. The tray 128 can be pivotally coupled to the main chassis 102 about a front edge 162. The pivotal tray 128 is transitionable between an extended position and withdrawn position. The front edge 162 can be one or more hinges coupling the tray 128 with the main chassis 102. In at least one embodiment, the hinges are coupled with the first and second flange 110, 112. In other embodiments, the hinges are coupled with lower sidewalls 106, 108.

In the extended position, the tray 128 is pivoted to be at least partially outside of the main chassis 102. In the withdrawn position, the tray 128 is substantially received within the main chassis 102.

The tray 128 can also include a cable management arrangement 156 configured to route cables within the tray 128 so as to not interfere with the front edge 162. The cable management arrangement 156 can be one or more grooves to guide cables along the bottom surface of the tray 128 and coupling with the lower portion 132 adjacent to the front edge 156. The cables securing to the bottom surface of the tray 128 and coupling with the lower portion 132 at the front edge 162 prevents interference between the cables and the tray 128 when transitioning between the extended and withdrawn positions.

Figure 12:
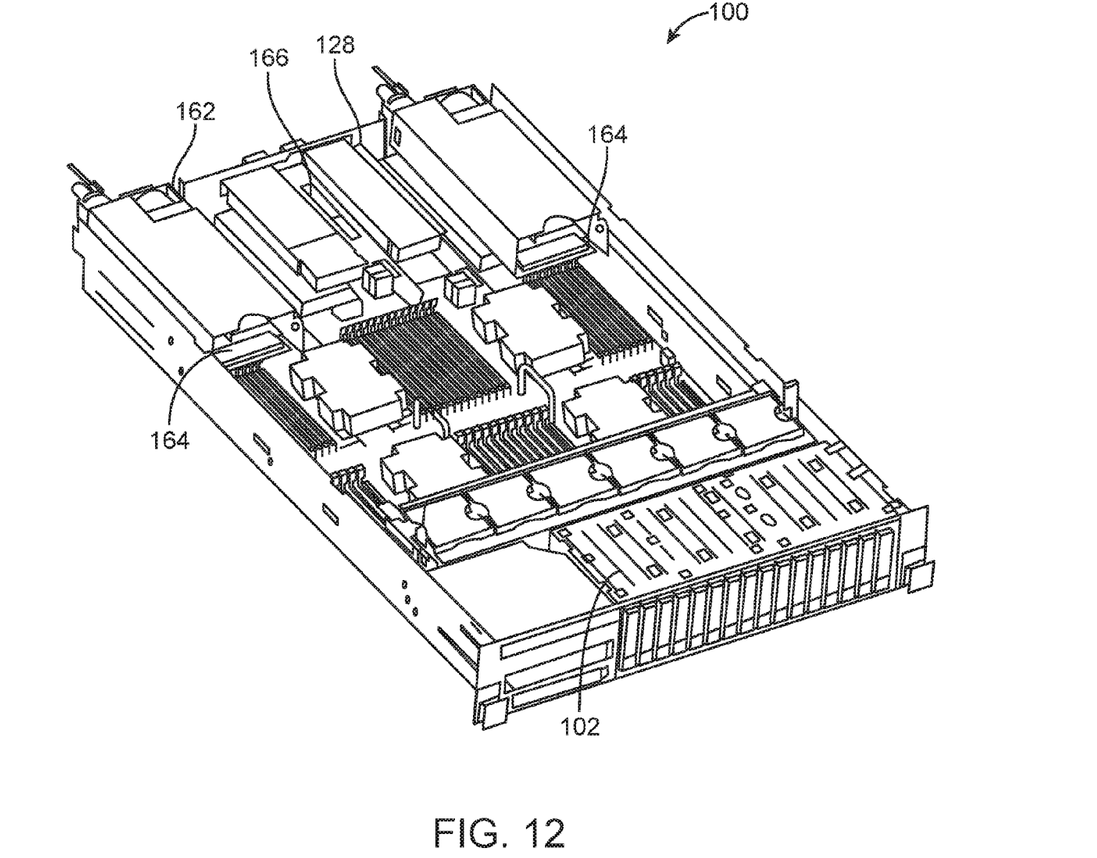
FIG. 12 is an isometric view of an example embodiment of a split removable tray of a configurable server chassis in a withdrawn position.

FIG. 12 illustrates a configurable server chassis 100 having a split removable tray 128 in a withdrawn position. The tray 128 can be split along the longitudinal axis of the configurable server chassis 100 into two or more individually configurable sections 164. The configurable sections 164 can be configured to engage each other for support or can be independent of one another. The configurable sections 164 can be transitionable between a withdrawn position and an extended position. Similar to above, in the withdrawn position the configurable sections 164 are substantially received within the main chassis 102. In the extended position, the configurable sections are configured to be at least partially outside of the main chassis 102.

In the illustrated embodiment, the tray 128 has two configurable sections 164 independent of each other. The tray 128 also has a middle section 166 disposed between the two configurable sections 164. The middle section 166 can provide space for components such as fans, cooling devices, power, storage, or other components. In at least one embodiment, the middle section 166 is a configurable section 166.

Figure 13:
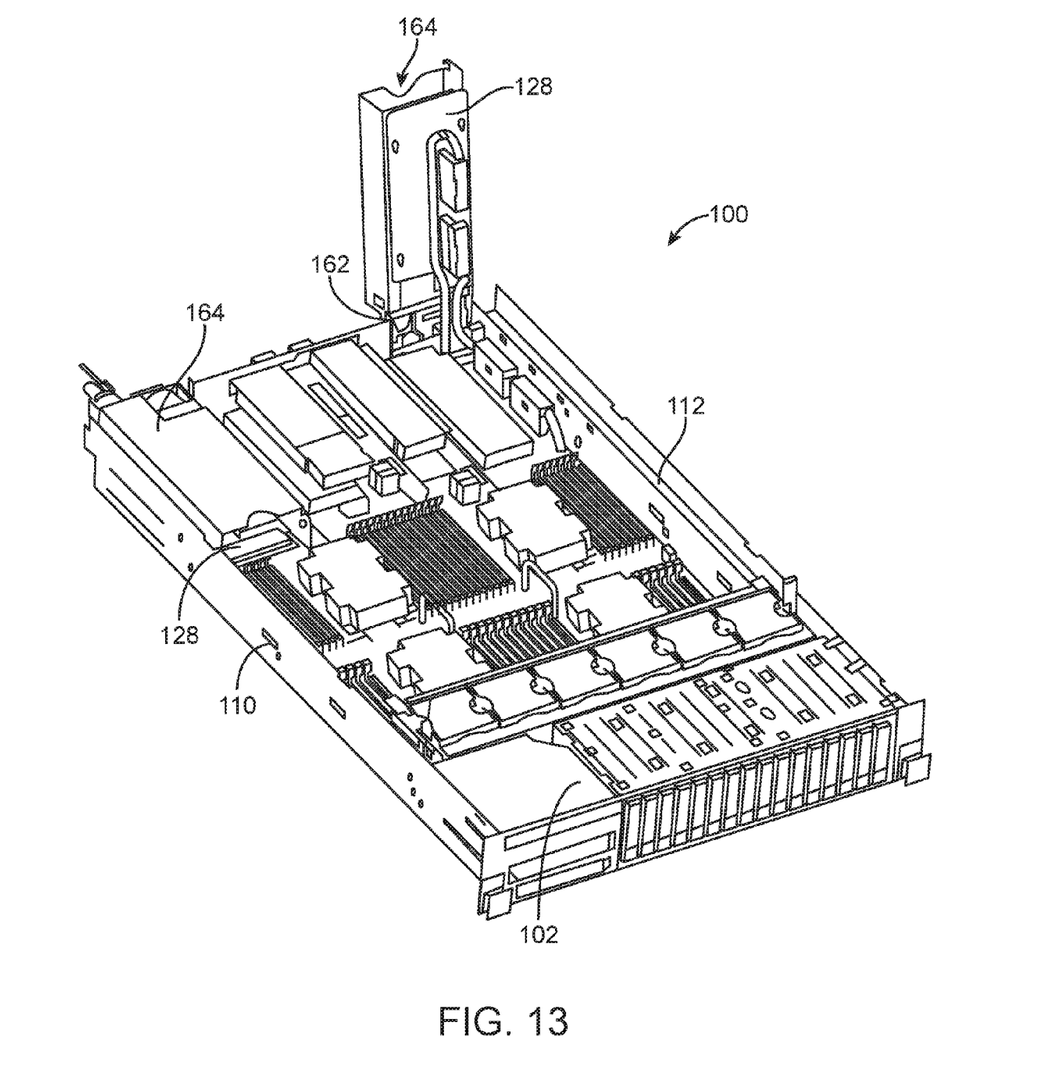
FIG. 13 is an isometric view of a first embodiment of a split removable tray of a configurable server chassis in an extended position.

FIG. 13 illustrates a first embodiment of the split removable tray 128 in an extended position. The configurable section 164 is pivoted at least partially outside of the main chassis 102 along a front edge 162. The front edge 162 is substantially perpendicular to each flange 110, 112. As can be appreciated in FIG. 13, each configurable section 164 pivots over the front edge 162, thereby removing at least a portion of the configurable section 164 from the main chassis 102 and providing access to the lower portion 132. The middle section 166 remains stationary within the main chassis 102. While the illustrated embodiment is drawn to two configurable sections 164, it is within the scope of this disclosure to include more than two configurable sections 164, for example three independent configurable sections 164.

Figure 14:
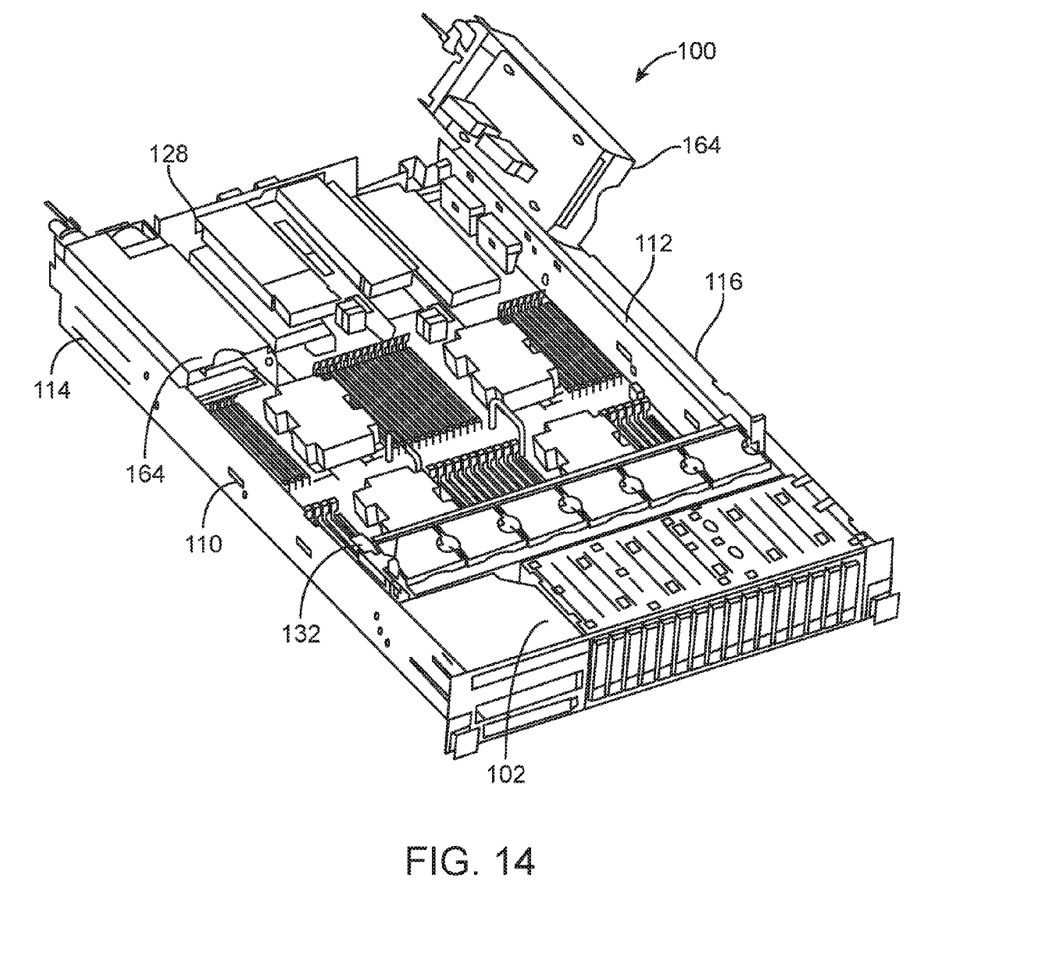
FIG. 14 is an isometric view of a second embodiment of a split removable tray of a configurable server chassis in an extended position.

FIG. 14 illustrates a second embodiment of the split removable tray 128 in an extended position. The configurable section 164 is pivoted at least partially outside of the main chassis 102 along a longitudinally extending edge. The longitudinally extending edge is substantially parallel to each flange 110, 112. As can be appreciated in FIG. 14, each configurable section 164 pivots over the first or second upper sidewalls 114, 116 and provide access to the lower portion 132. While the middle section 166 of the illustrated embodiment is not pivotally coupled with the main chassis 102, it is within the scope of this disclosure to pivotally couple the middle section 166 with the main chassis 102. Further, while the illustrated embodiment is shown with two configurable sections 164, it is within the scope of this disclosure to implement more than two, for example four independent configurable sections 164.

As can be appreciated in FIGS. 13 and 14, the configurable sections 164 have substantially smooth peripheral edge surfaces. In other embodiments, the configurable sections 164 can have interlocking peripheral edges configured to engage with each other, or with the middle section 166. The interlocking edges can provide structural support between the configurable sections 164 and assist in securing each configurable section 164 within the withdrawn position.

It is believed the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiments of the disclosure.

What is claimed is:

1. A server chassis comprising:
a main chassis having a bottom surface, and first and second lower sidewalls vertically extending from opposing sides of the bottom surface;
first and second flanges extending horizontally outward from the first and second lower sidewalls, respectively;
first and second upper sidewalls vertically extending from the first and second flanges, respectively; and
a tray received in the main chassis and rests on each of the flanges, thereby dividing at least a portion of the main chassis into an upper portion and a lower portion having different widths, wherein the tray spans less than a full length of the first and second flanges,
wherein the distance between the first and second upper sidewalls is greater than the distance between first and second lower sidewalls, wherein a first lateral recess is defined by the first lower sidewall and the first flange, and a second lateral recess is defined by the second lower sidewall and the second flange, and wherein the first lateral recess and the second recess are configured to receive a rail defining an outer boundary substantially flush with the first and second sidewalls, respectively.

2. The server chassis of claim 1, wherein the tray has vertically extending tray sidewalls substantially parallel to the upper sidewalls, and each of the tray sidewalls has one or more protrusions outwardly extending therefrom configured to be received in a corresponding grooves formed on the upper sidewalls, thereby coupling the tray with the main chassis.

3. The server chassis of claim 1, wherein the tray has vertically extending tray sidewalls substantially parallel to the upper sidewalls, and each of the upper sidewalls has one or more protrusions inwardly extending therefrom configured to be received in a corresponding grooves formed on the tray sidewalls, thereby coupling the tray with the main chassis.

4. The server chassis of claim 1, wherein the tray is slidably coupled to the main chassis and configured to slide between an extended position and a withdrawn position.

5. The server chassis of claim 1, wherein the tray is pivotally attached to the main chassis at a front edge and is pivotable between an extended position away from the main chassis and a withdrawn position.

6. The server chassis of claim 1, wherein the distance between the lower sidewalls is approximately 430 millimeters and the distance between the upper sidewalls is approximately 447 millimeters.

7. A server chassis comprising:
a main chassis having a bottom surface, and first and second lower sidewalls vertically extending from opposing sides of the bottom surface;
first and second flanges extending horizontally from the first and second lower sidewalls, respectively;
first and second upper sidewalls vertically extending from the first and second flanges, respectively; and
a tray is mounted in the main chassis, thereby dividing at least a portion of the main chassis into an upper portion and a lower portion having different widths, wherein the tray spans less than a full length of the first and second flanges,
wherein the first and second lower sidewalls define a lower distance and the first and second upper sidewalls define an upper distance, wherein an offset is formed between the first upper sidewall and first lower sidewall forming a first lateral recess therebetween and an offset formed between the second upper sidewall and the second lower sidewall forming a second lateral recess therebetween, and wherein the first lateral recess and the second lateral recess are configured to receive a rail defining an outer boundary substantially flush with the first and second sidewalls, respectively.

8. The server chassis of claim 7, wherein the tray has vertically extending tray sidewalls substantially parallel to the upper sidewalls, and each of the tray sidewalls has one or more protrusions outwardly extending therefrom configured to be received in a corresponding grooves formed on the upper sidewalls, thereby coupling the tray with the main chassis.

9. The server chassis of claim 7, wherein the tray has vertically extending tray sidewalls substantially parallel to the upper sidewalls, and each of the upper sidewalls has one or more protrusions inwardly extending therefrom configured to be received in a corresponding grooves formed on the tray sidewalls, thereby coupling the tray with the main chassis.

10. The server chassis of claim 7, wherein the tray is slidably coupled to the main chassis and configured to slide between an extended position and a withdrawn position.

11. The server chassis of claim 7, wherein the tray is pivotally attached to the main chassis at a front edge and pivotable between an extended position and a withdrawn position.

12. The server chassis of claim 7, wherein the distance between the lower sidewalls is approximately 430 millimeters and the distance between the upper sidewalls is approximately 447 millimeters.

* * * * *